United States Patent [19]

Tregilgas et al.

[11] Patent Number: 4,501,625
[45] Date of Patent: Feb. 26, 1985

[54] METHOD OF PRODUCING HOMOGENEOUSLY DOPED HGCDTE WHICH CONTAINS A FAST DIFFUSING DOPANT IMPURITY

[75] Inventors: John H. Tregilgas, Richardson; Jeffrey D. Beck, Plano; Michael A. Kinch, Dallas; Herbert F. Schaake, Denton, all of Tex.

[73] Assignee: Texas Instruments Incorporated, Dallas, Tex.

[21] Appl. No.: 564,953

[22] Filed: Dec. 23, 1983

[51] Int. Cl.$^3$ .............................. H01L 21/324
[52] U.S. Cl. .................... 148/20.3; 148/1.5; 148/191
[58] Field of Search .................. 148/1.5, 191, 20.3

[56] References Cited

U.S. PATENT DOCUMENTS

| | | | |
|---|---|---|---|
| 3,954,518 | 5/1976 | Schmit et al. | 148/20.3 |
| 3,963,540 | 6/1976 | Camp, Jr. et al. | 148/20.3 |
| 3,979,232 | 9/1976 | Hager et al. | 148/20.3 |
| 4,028,145 | 6/1977 | Kasenga | 148/20.3 |
| 4,116,725 | 9/1978 | Shimizu | 148/20.3 |
| 4,318,217 | 3/1982 | Jenner et al. | 29/572 |

Primary Examiner—Aaron Weisstuch
Attorney, Agent, or Firm—Robert Groover, III; James T. Comfort; Melvin Sharp

[57] ABSTRACT

The disclosure relates to a method for making extrinsically doped HgCdTe alloys containing Cu, Ag, or Au or other dopant impurity whereby the excess tellurium in the core is annihilated (stoichiometrically compensated by excess in-diffusing Hg) and the dopant impurities are then permitted to randomly move through the slab to provide for homogeneity thereof. A post-annealing step of much greater than normal temperature-time length than was provided in the prior art is used. A standard post-annealing step in a saturated mercury vapor atmosphere leaves second phase tellurium (and gettered impurities) at the center of the slab, and longer term post-annealing negates this situation by annihilating the second phase tellurium in the slab and thus permitting the impurities to randomly travel by solid state diffusion throughout the slab to ultimately be distributed therein in a homogeneous manner. The additional time required for the post-annealing step following the normal prior art post-annealing step varies based upon slice or slab thickness, the metal-Te stoichiometry, and second post-annealing step temperature and, in general, will be longer but in the same range as that used in the prior post-annealing stage. Following annihilation of the second phase tellurium from the core, the impurity is homogenized in the slab by further annealing for from about one hour to about 20 weeks at a temperature under 300° C., preferably 280° C., by solid state diffusion.

16 Claims, 4 Drawing Figures

METHOD OF PRODUCING HOMOGENEOUSLY DOPED HGCDTE WHICH CONTAINS A FAST DIFFUSING DOPANT IMPURITY

BACKGROUND OF THE INVENTION

1. Field of the Invention

This invention relates to the preparation of semiconductor alloys of the formula $Hg_{(1-x)}Cd_xTe_1$, generically referred to as "HgCdTe" where X is in the range of from about 0.14 to about 0.40 for infrared applications.

2. Description of the Prior Art

Alloys containing mercury, cadmium, and tellurium having the general formulation set forth hereinabove have been reported in the prior art, particularly as having semiconductor properties, and have been mentioned particularly in conjunction with their use as infrared detectors and the like. Some of the principal requirements of the materials used in such applications are (1) compositional uniformity, i.e., constant of the alloying parameter X throughout the alloy; (2) low carrier concentration due to unintentionally introduced impurities (ideally less than $10^{15}$ per centimeter$^3$; (3) good crystal quality (low density of vacancies and of dislocations); and (4) homogeneity of the distribution of the dopant in the alloy.

In the prior art, the production of homogeneously doped HgCdTe has presented a problem because gettering of the impurities has been demonstrated to occur in this alloy such that the fast diffusing dopant impurities such as copper, silver, or gold and possibly others are swept into the core of a partially post-annealed alloy slice. This is a particular problem since these attractive P-type dopants are very mobile. The reasons for this situation appear to be as set forth hereinbelow.

In accordance with prior art, doped slabs of HgCdTe have been prepared by initially preparing an ingot thereof by placing the appropriate amounts of mercury, cadmium, tellurium, and the impurity into a quartz ampoule, sealing the ampoule and then heating the ampoule and contents to a temperature in excess of 800° C. until a liquid has been formed and then retaining that temperature for about a half day. The liquid is then shaken to distribute the contents of the ampoule therein and the ampoule is then quenched by blowing nitrogen gas thereon to provide the solid ingot within the ampoule. The ingot provided is non-homogeneous and polycrystalline in nature, being formed of small crystals. These crystals have random crystallographic orientations. The ingot is then made to undergo recrystallization and homogenization which is essentially an annealing step which takes place for a period of about four weeks at a temperature in excess of 650° C. but below the melting point of the crystal. During recrystallization, one or more large crystals are formed from the polycrystalline material. This process permits solid state diffusion of the components of the ingot to provide a much greater degree of homogeneity in the large crystal ingot. The ingot is then cut into slabs or slices of predetermined thickness and the slabs are then subjected to a post-annealing step in a saturated mercury vapor atmosphere for a period of one to four weeks at a temperature below 300° C., preferably about 280° C., (so as to reduce the metal vacancy concentration of the outer surface by in-diffusing Hg. This process leaves a device quality region known as the skin depth ranging from about 2 to 15 mils.) The post-anneal of thick slices greater than twice the skin depth leaves a core of second phase tellurium as well as impurities in the central portion of the slab. As can be seen, though there is a great degree of homogeneity at the skin or surface of the slab, the fast diffusing impurities, are gettered in the central region or core of the slab by vacancies associated with the Te precipitates there, and therefore do not provide the desired homogeneous distribution of impurity or doping agent throughout the slab as desired.

SUMMARY OF THE INVENTION

In accordance with the present invention, there is provided a method for making extrinsically doped P-type HgCdTe containing Cu, Ag, or Au as a dopant impurity, whereby the metal vacancies and second phase tellurium in the core are annihilated (by excess in-diffusing Hg) and the dopant impurities are then permitted to randomly move through the slab to provide for homogeneity thereof throughout the slab. It has now been determined that a post-annealing step of much greater than normal time length than was provided in the prior art will overcome this problem. Though a standard post-annealing step in a saturated mercury vapor atmosphere leaves second phase tellurium (and gettered impurities) at the center of the slab or core, "an extended post anneal" will alter this situation by annihilating the second phase tellurium in the core region of the slab and thus permit the impurities to randomly travel by solid state diffusion throughout the slab and ultimately be distributed therein in a homogeneous manner. The exact time to accomplish this homogenization will depend on the stoichiometric composition of the material after recrystallization, the thickness of the slice, and the temperature at which the post-anneal is done. Other methods for producing HgCdTe, such as liquid phase epitaxy can also influence these conditions.

DESCRIPTION OF THE PREFERRED EMBODIMENT

Figure 1:
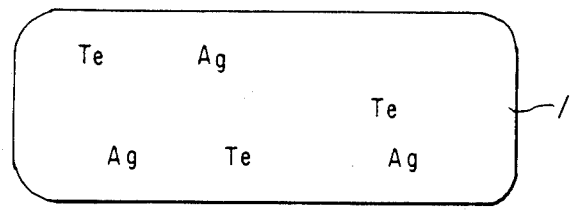
FIG. 1 is a schematic diagram of an HgCdTe ingot with dopant and excess Te dispersed therein after recrystallization and homogenization.
Figure 4:
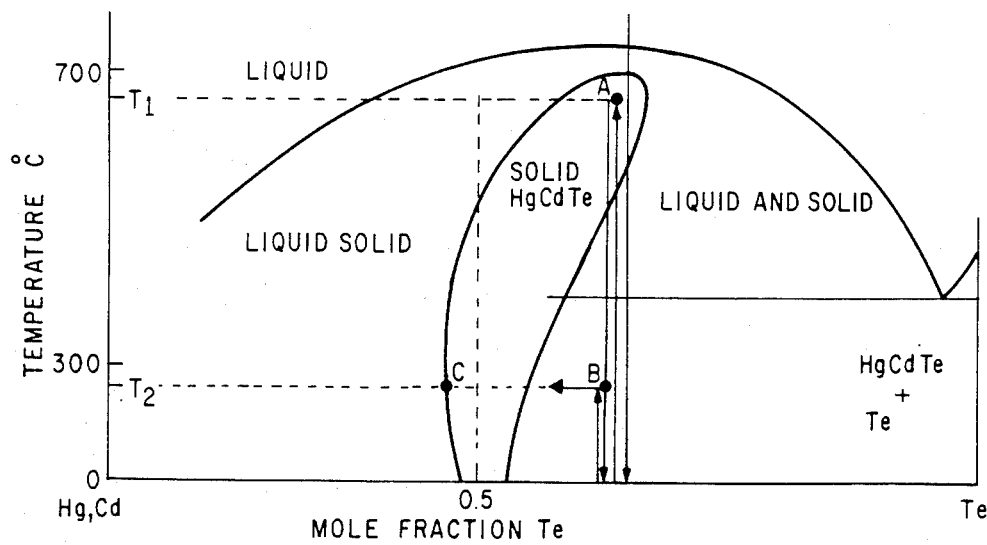
FIG. 4 is a schematic showing of the standard bulk recrystallization process in the formation of slabs of HgCdTe.

Referring now to FIG. 1, there is shown an ingot 1 composed of mercury, cadmium, and tellurium in accordance with the formulation set forth hereinabove, wherein X is in the range of 0.14-0.4, which is provided with an excess of tellurium atoms in the range of $10^{17}$ to $10^{20}$ per cubic centimeter and with a small amount of silver or other dopant therein. The HgCdTe can be doped later, if desired, such as after core annihilation. The ingot was recrystallized and homogenized for a period of about one to about four weeks at a temperature above 650° C. to the melting point of the solid, about 680° C. The ingot was then sliced into slabs having thickness dimensions of, in one case, 10 mils, in a second case, 20 mils and, in a third case, 40 mils. The slabs were then post-annealed at a temperature of 270° C. ($T_2$ in FIG. 4) in a saturated mercury vapor atmosphere for a period of one week, thereby going from point B to point C in FIG. 4. By use of microstructural etching techniques, it was shown that radioactive silver collects in the P-type portion or core 3 of the slab 5 containing second phase tellurium as shown in FIG. 2.

Figure 2:
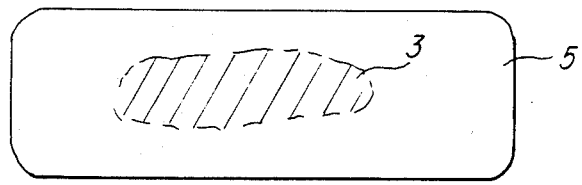
FIG. 2 is a schematic diagram as in FIG. 1 after the first post-annealing step.

In order to homogenize the fast diffusing silver impurities and/or other impurities, the second phase tellurium region 3 of FIG. 2, also referred to as the "core" of the HgCdTe, must be annhilated, annihilation of the tellurium core being a function of material composition, annealing temperature, surrounding Hg vapor pressure and, to a lesser extent, of defects which may enhance diffusion of Hg.

In order to annihilate second phase tellurium from the slab, post-annealing in a saturated Hg atmosphere at 280° C. must be sufficiently long to react the indiffusing Hg with the excess Te and aninhilate excess metal vacancies. The duration of the post-annealing period required for annihilation of the second phase Te is based upon slice thickness as follows:

| SLICE THICKNESS | TIME REQUIRED FOR Te CORE ANNIHILATION |
| --- | --- |
| 10 mils | 0.5 weeks to 2.8 weeks |
| 20 mils | 0.7 weeks to 4 weeks |
| 40 mils | 1.0 to 5.6 weeks |

Figure 3:
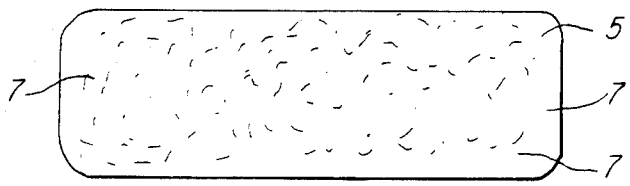
FIG. 3 is a schematic diagram of an HgCdTe slab after annihilation of second phase Te and further annealing to provide homogeneous doping throughout the slab.

This schedule is approximate since the stoichiometry of the recrystallized material, post anneal temperature and slab thickness determine the precise time required for Te annihilation and impurity homogenization. Following the annihilation of the tellurium from the core, the silver or other dopant impurity 7 is homogenized in the slab 5 by providing a longer term annealing of one day to a week at a post-annealing temperature of 280° C. as shown in FIG. 3. It should be understood that lower post-annealing temperatures can be used but it will be required that the annealing take place for a longer period of time and, conversely, higher temperatures will shorten the post-annealing time. Similarly, variations in the amount of excess Te, which are established within the solid phase existence limits at the recrystallization temperature, or upon cooling from the recrystallization temperature prior to post annealing, can influence the exact time required to achieve annihilation of the second phase Te from the core. More excess Te will suppress the skin depth formation rate for a given post anneal, whereas, less excess Te will increase the skin depth for fixed post annealing conditions. Thin films of HgCdTe, grown by the liquid phase epitaxial process on CdTe substrates, need only to be post annealed for relatively short times to effect Te annihilation and the homogeneous distribution of the fast diffusing impurities throughout the film. The gettering of these fast diffusing impurities does not occur in the CdTe substrates. For example, impurities can be homogenized throughout a 30 micron film with several days post anneal at 280° C. Homogenization can be achieved in 10 micron films in one to three hours at 280° C.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of producing homogeneously doped HgCdTe which contains a fast diffusing dopant impurity, comprising the steps of:
   (a) providing a mass of HgCdTe containing said dopant impurity substantially homogeneously distributed therethrough;
   (b) annealing said mass in an Hg atmosphere to fully stoichiometrically compensate all excess Te in said mass; and
   (c) further annealing said mass to homogeneously distribute said dopant impurity in said mass.

2. A method as set forth in claim 1 wherein step (a) includes the step of recrystallizing and homogenizing said mass.

3. A method as set forth in claim 2 wherein step (a) includes an annealing step at a temperature above 650° C. for a period of about one to four weeks.

4. A method as set forth in claim 3 wherein step (b) comprises heating said mass for a period of about one hour to 20 weeks at a temperature less than 300° C.

5. A method as set forth in claim 4 wherein step (c) comprises heating said mass for a period of from about one hour to about four weeks at a temperature below 300° C.

6. A method as set forth in claim 3 wherein step (c) comprises heating said mass for a period of from about one hour to about four weeks at a temperature below 300° C.

7. A method as set forth in claim 2 wherein step (b) comprises heating said mass for a period of about one hour to 20 weeks at a temperature less than 300° C.

8. A method as set forth in claim 7 wherein step (c) comprises heating said mass for a period of from about one hour to about four weeks at a temperature below 300° C.

9. A method as set forth in claim 2 wherein step (c) comprises heating said mass for a period of from about one hour to about four weeks at a temperature below 300° C.

10. A method as set forth in claim 1 wherein step (a) includes an annealing step at a temperature above 650° C. for a period of aboout one to four weeks.

11. A method as set forth in claim 10 wherein step (b) comprises heating said mass for a period of about one hour to 20 weeks at a temperature less than 300° C.

12. A method as set forth in claim 11 wherein step (c) comprises heating said mass for a period of from about one hour to about four weeks at a temperature below 300° C.

13. A method as set forth in claim 10 wherein step (c) comprises heating said mass for a period of from about one hour to about four weeks at a temperature below 300° C.

14. A method as set forth in claim 1 wherein step (b) comprises heating said mass for a period of about one hour to 20 weeks at a temperature less than 300° C.

15. A method as set forth in claim 14 wherein step (c) comprises heating said mass for a period of from about one hour to about four weeks at a temperature below 300° C.

16. A method as set forth in claim 1 wherein step (c) comprises heating said mass for a period of from about one hour to about four weeks at a temperature below 300° C.

* * * * *